United States Patent
Doescher et al.

(10) Patent No.: US 11,378,617 B2
(45) Date of Patent: Jul. 5, 2022

(54) APPARATUS FOR PREDICTION OF FAILURE OF A FUNCTIONAL CIRCUIT

(71) Applicant: NXP B.V., Eindhoven (NL)

(72) Inventors: Michael Doescher, Hamburg (DE); Jan-Peter Schat, Hamburg (DE)

(73) Assignee: NXP B.V., Eindhoven (NL)

( * ) Notice: Subject to any disclaimer, the term of this patent is extended or adjusted under 35 U.S.C. 154(b) by 322 days.

(21) Appl. No.: 16/176,372

(22) Filed: Oct. 31, 2018

(65) Prior Publication Data
US 2019/0187204 A1 Jun. 20, 2019

(30) Foreign Application Priority Data
Dec. 19, 2017 (EP) .................................. 17208592

(51) Int. Cl.
*G01R 31/28* (2006.01)
*G01R 31/30* (2006.01)

(52) U.S. Cl.
CPC ..... *G01R 31/2884* (2013.01); *G01R 31/2856* (2013.01); *G01R 31/3004* (2013.01); *G01R 31/3016* (2013.01)

(58) Field of Classification Search
CPC ............ G01R 31/2884; G01R 31/2856; G01R 31/3004; G01R 31/3016; G01R 31/2872; G11C 29/12005
USPC ......... 714/710, 718, 719, 723, 724, 726, 30, 714/733; 734/365, 200, 201; 716/4
See application file for complete search history.

(56) References Cited

U.S. PATENT DOCUMENTS

| 6,047,243 | A | 4/2000 | Bang et al. |
| 7,005,871 | B1* | 2/2006 | Davies ............... G01R 31/2856 324/750.3 |
| 2008/0301511 | A1* | 12/2008 | Miller .............. G01R 31/31928 714/733 |
| 2010/0271064 | A1* | 10/2010 | Kohler ............... G11C 29/4401 324/750.05 |
| 2011/0102005 | A1* | 5/2011 | Feng .................. G01R 31/2856 324/750.3 |

(Continued)

FOREIGN PATENT DOCUMENTS

FR 2931946 A1 12/2009

OTHER PUBLICATIONS

Aryan, N., "Monitoring Concepts for Degradation Effects in Digital CMOS Circuits", Dissertation, Technische Universitat Munchen, Mar. 3, 2015.

(Continued)

*Primary Examiner* — Alvaro E Fortich
*Assistant Examiner* — Zannatul Ferdous

(57) ABSTRACT

An apparatus comprising:
a functional circuit comprising one or more circuit components configured to perform a function based on one or more first input signals;
at least one failure-prediction circuit for use in predicting failure of the functional circuit, the failure-prediction circuit comprising a replica of the functional circuit in terms of constituent circuit components;
wherein the failure-prediction circuit is configured to be more susceptible to failure than said functional circuit,
wherein the apparatus is configured to provide a prediction of failure of the functional circuit based on a determination of failure of the failure-prediction circuit.

20 Claims, 4 Drawing Sheets

(56) References Cited

U.S. PATENT DOCUMENTS

2014/0088947 A1* 3/2014 Anemikos ........ G11C 29/12005
  703/14
2017/0147738 A1* 5/2017 Saraswat ................. G06F 30/39
2019/0154475 A1* 5/2019 Chen .................. G01R 31/2801

OTHER PUBLICATIONS

Calhoun, B., "Standby Power Reduction Using Dynamic Voltage Scaling and Canary Flip-Flop Structures", IEEE Journal of Solid-State Circuits, vol. 39, No. 9, Sep. 2004.
Kim, T., "Silicon Odometer: An On-Chip Reliability Monitor for Measuring Frequency Degradation of Digital Circuits", IEEE Journal of Solid-State Circuits, vol. 43, No. 4, Apr. 2008.

* cited by examiner

APPARATUS FOR PREDICTION OF FAILURE OF A FUNCTIONAL CIRCUIT

CROSS-REFERENCE TO RELATED APPLICATIONS

This application claims the priority under 35 U.S.C. § 119 of European Patent application no. 17208592.0, filed on 19 Dec. 2017, the contents of which are incorporated by reference herein.

The present disclosure relates to an apparatus for providing failure-prediction of a circuit and a related method.

According to a first aspect of the present disclosure there is provided an apparatus comprising:

a functional circuit comprising one or more circuit components configured to perform a function based on one or more first input signals;

at least one failure-prediction circuit for use in predicting failure of the functional circuit, the failure-prediction circuit comprising a replica of the functional circuit in terms of constituent circuit components;

wherein the failure-prediction circuit is configured to be more susceptible to failure than said functional circuit in terms of one or more of:
  (a) the one or more circuit components of the failure-prediction circuit are fabricated having one or more dimensions more susceptible to failure than the corresponding dimensions of the functional circuit;
  (b) the one or more circuit components of the failure-prediction circuit, at least in part, are fabricated having a different shape more susceptible to failure than the corresponding shape of the functional circuit;
  (c) the failure-prediction circuit is configured to be provided with one or more second input signals based on the one or more first input signals, the one or more second input signals comprising at least one property that is greater in magnitude than the corresponding property of the one or more first input signals; and
  (d) the failure-prediction circuit is positioned relative to the functional circuit such that, in use, the failure-prediction circuit experiences a higher operating condition than the functional circuit and wherein the higher operating condition is one or more of, in use, a higher operating temperature and a higher local magnetic field strength;

wherein the apparatus is configured to provide a prediction of failure of the functional circuit based on a determination of failure of the failure-prediction circuit.

In one or more embodiments the determination of failure of the failure-predication circuit may comprise the determination that an output of the failure-prediction circuit is outside of a predetermined acceptable range.

In one or more embodiments, the one or more dimensions of the circuit components of the failure-prediction circuit may comprise one or more of:
  (a) the area of a junction of a transistor component of the one or more circuit components;
  (b) the width of a terminal of an electronic component of the one or more circuit components; and
  (c) the thickness of a semi-conductor layer of the one or more circuit components.

In one or more embodiments, the one or more second input signals may be based on the one or more first input signals at least in terms of the apparatus being configured to provide the one or more second input signals to the failure-prediction circuit for substantially the same time duration that the one or more first input signals are received by the functional circuit.

In one or more embodiments, the one or more second input signals may have a property that is greater in magnitude than the corresponding property of the one or more first input signals in terms of having one or more of:
  (a) a greater voltage magnitude;
  (b) a greater current magnitude;
  (c) a greater frequency magnitude;
  (d) a greater period magnitude; and
  (e) a greater bandwidth magnitude.

In one or more embodiments, the greater frequency magnitude may refer to one or more of: a greater signal frequency magnitude; and a greater frequency of an application of programming/deleting operations, at least in terms of peak frequency or an average frequency over a predetermined sample period.

In one or more embodiments, the different shape more susceptible to failure may comprise a shape of a part of the one or more components that provides for a greater local current density, when in use, than the corresponding part of the one or more components of the functional circuit. In one or more examples, the shape may be configured to be more pointed. In one or more examples, the differing shape may be applied to one or more of the corner of a terminal and an edge or a corner of a layer, such as a metallisation layer or semiconductor layer.

In one or more embodiments, the apparatus may be configured to provide for determination of the failure of the failure-prediction circuit in accordance one or more of the following time schedules:
  (a) at predetermined intervals;
  (b) on start-up of the apparatus; and
  (c) on receipt of an instruction signal from a device remote from the apparatus.

In one or more embodiments, the apparatus may further comprise a testing block configured to provide said prediction of failure based on measurement of the failure of the failure-prediction circuit.

In one or more embodiments, the apparatus may be configured, on determination that the failure-prediction circuit has failed, to provide for signalling to be sent to one or more of:
  (a) a remote device;
  (b) a remote circuit comprising part of the apparatus; and
  (b) a display for providing a warning.

In one or more embodiments, the failure-prediction circuit may be a first failure-prediction circuit and the apparatus may further comprise a second failure-prediction circuit, the circuit components of the second failure-prediction circuit configured to provide one or more second output signals which are not used to provide said function, wherein the second failure-prediction circuit may be configured to be more susceptible to failure than said functional circuit in terms of one or more of:
  (a) the one or more circuit components of the second failure-prediction circuit are fabricated having one or more dimensions more susceptible to failure than the corresponding dimensions of the functional circuit;
  (b) the one or more circuit components of the second failure-prediction circuit, at least in part, are fabricated having a different shape more susceptible to failure than the corresponding shape of the functional circuit;
  (c) the second failure-prediction circuit is configured to be provided with one or more third input signals, the one or more third input signals comprising at least one property that is greater in magnitude than the corresponding property of the one or more first input signals; and (d) the second failure-prediction circuit is positioned relative to the functional circuit such that, in use, the second failure-prediction circuit experiences a higher operating condition than the functional circuit, and wherein the higher operating condition is one or more of, in use, a higher operating temperature and a higher local magnetic field strength, and wherein the apparatus is further configured to provide a prediction of failure of the functional circuit based on a determination of failure of the second failure-prediction circuit.

In one or more embodiments, the second failure-prediction circuit may be configured to be more susceptible to failure than the first failure-prediction circuit in terms of:

(a) the one or more circuit components of the second failure-prediction circuit are fabricated having one or more dimensions more susceptible to failure than the corresponding dimensions of the first failure-prediction circuit;

(b) the one or more circuit components of the second failure-prediction circuit, at least in part, are fabricated having a different shape more susceptible to failure than the corresponding shape of the first failure-prediction circuit;

(c) the second failure-prediction circuit is configured to be provided with one or more third input signals based on the one or more first input signals, the one or more third input signals comprising at least one property that is greater in magnitude than the corresponding property of the one or more second input signals; and (d) the second failure-prediction circuit is positioned relative to the first failure-prediction circuit such that, in use, the second failure-prediction circuit experiences a higher operating condition than the first failure-prediction circuit and wherein the higher operating condition is one or more of, in use, a higher operating temperature and a higher local magnetic field strength.

In one or more embodiments, the second failure-prediction circuit may be configured to have the same susceptibility to failure as the first failure-prediction circuit in terms of:

(a) the one or more circuit components of the second failure-prediction circuit are fabricated having one or more dimensions equally susceptible to failure as the corresponding dimensions of the first failure-prediction circuit;

(b) the one or more circuit components of the second failure-prediction circuit are fabricated having a shape equally susceptible to failure as the corresponding shape of the first failure-prediction circuit;

(c) the second failure-prediction circuit is configured to be provided with one or more third input signals based on the one or more first input signals, the one or more third input signals comprising at least one property that is equal in magnitude to the corresponding property of the one or more second input signals; and (d) the second failure-prediction circuit is positioned relative to the first failure-prediction circuit such that, in use, the second failure-prediction circuit experiences the same operating condition as the functional circuit and wherein the operating condition is one or more of, in use, an operating temperature and a local magnetic field strength.

In a second aspect of the present disclosure, there is provided an electronic device comprising the apparatus of any preceding embodiment, wherein the function performed by the functional circuit is used by the electronic device and the electronic device comprises one of: an automotive safety system device; a medical equipment device; an aeronautical safety-critical circuit; and an industrial safety system device.

In a third aspect of the present disclosure, there is provided a method for providing prediction of failure of a functional circuit of an apparatus, the apparatus comprising:
the functional circuit configured to receive one or more first input signals;
a failure-prediction circuit for use in predicting failure of the functional circuit, the failure-prediction circuit comprising a replica of the functional circuit in terms of constituent circuit components;
wherein the failure-prediction circuit is configured to be more susceptible to failure than said functional circuit in terms of one or more of:
(a) the one or more circuit components of the failure-prediction circuit are fabricated having one or more dimensions more susceptible to failure than the corresponding dimensions of the functional circuit;
(b) the one or more circuit components of the failure-prediction circuit, at least in part, are fabricated having a different shape more susceptible to failure than the corresponding shape of the functional circuit;
(c) the failure-prediction circuit is configured to be provided with one or more second input signals based on the one or more first input signals, the one or more second input signals comprising at least one property that is greater in magnitude than the corresponding property of the one or more first input signals; and
(d) the failure-prediction circuit is positioned relative to the functional circuit such that, in use, the failure-prediction circuit experiences a higher operating condition than the functional circuit and wherein the higher operating condition is one or more of, in use, a higher operating temperature and a higher local magnetic field strength,
predicting the failure of the functional circuit based on determining the failure of the failure-prediction circuit.

In one or more embodiments, the method of the third aspect may further comprise the step of, on determination that the failure-prediction circuit has failed, providing for signalling to be sent to:
(a) a remote device;
(b) a remote circuit comprising part of the apparatus; and
(b) a display for providing a warning.

In one or more embodiments, the apparatus may comprise a plurality of failure-prediction circuits for use in predicting failure of the functional circuit, each of the plurality of failure-prediction circuits comprising a replica of the functional circuit in terms of constituent circuit components, and
the step of predicting the failure of the functional circuit may comprise determining the failure of at least a predetermined number of the plurality of failure-prediction circuits.

According to a fourth aspect of the present disclosure, there is provided an apparatus comprising:
a functional circuit comprising one or more circuit components configured to perform a function;
at least one failure-prediction circuit for use in predicting failure of the functional circuit, the failure-prediction circuit comprising a replica of the functional circuit in terms of constituent circuit components;

wherein the failure-prediction circuit is configured to be more susceptible to failure than said functional circuit; and wherein the apparatus is configured to provide a prediction of failure of the functional circuit based on a determination of failure of the failure-prediction circuit.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which.

Figure 1:
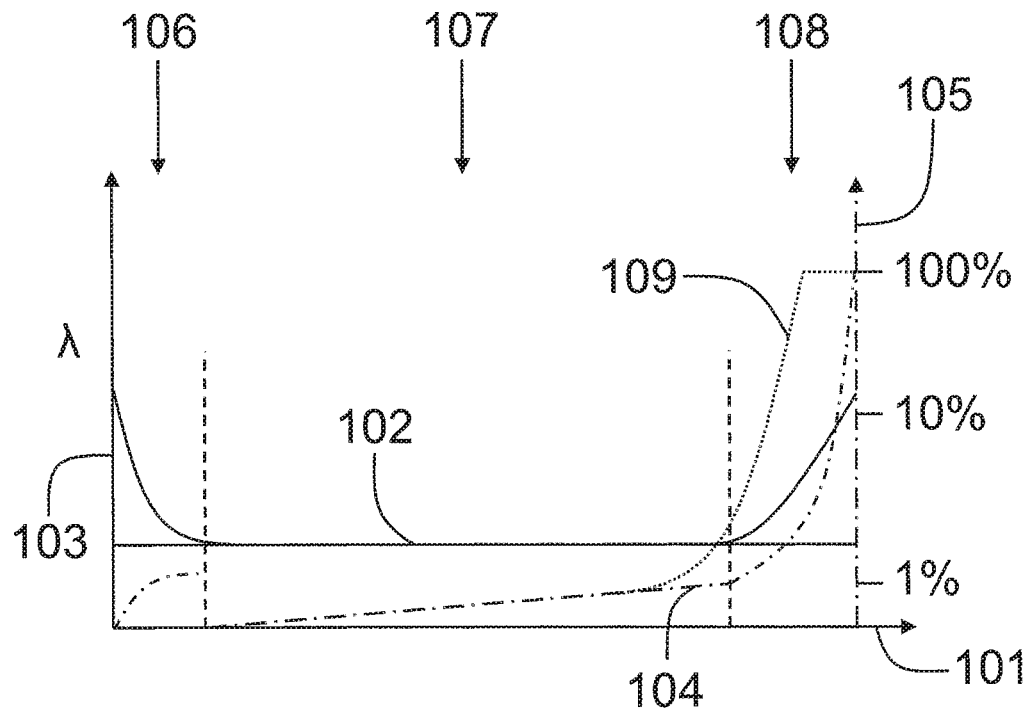
FIG. 1 shows an example graph of failure occurrences and rates for a circuit with time.

The failure of a circuit can cause an apparatus to become non-functional or generate erroneous output. In many cases this may be annoyance for a user but in safety critical devices the consequences of failure may be more important. It will be appreciated that failure may refer to a state where the circuit is completely non-functional. Alternatively, failure may refer to a state where the circuit does not operate within acceptable operational parameters, for example where the circuit produces too much noise, consumes too much energy or emits too much radiation. Predicting the failure of the circuit, in more than one examples, may be difficult. The quality-over-lifetime performance of an average circuit is usually illustrated by the well-known "bathtub curve", shown in FIG. 1. The horizontal axis 101 of the graph denotes the progression of time. The solid trend line 102 of FIG. 1 shows the rate of failure occurrence for a batch of circuits which is measured as a failure rate, A, displayed on the left-hand axis 103. The cumulative number of failures in the batch are represented by the dotted and dashed trend line 104 and are measured as a percentage of the number of possible failures, measured on the right-hand axis 105 between 0-100%. The first subsection 106 of FIG. 1 shows the failure rate 102 and cumulative number of failures 104 which accumulate in the early life of a batch of devices. It can be seen that, while there are initially a number of failures in the early lifetime 106 ƒ the device which may arise due to mis-fabrication or for other reasons, the rate rapidly reduces to a substantially constant rate of failures. The number of failures by the end of the early life period (subsection 106) is taken to be the baseline number of failures and as such is shown as 0%. In the second subsection 107 of FIG. 1, the failure rate 102 is substantially constant and leads to a steady increase in the total number of failures 104. The low rate of errors means that during the majority of its use life, the likelihood of failure is acceptably low, particularly if redundancy is built into a system. The third subsection 108 of FIG. 1 represents the end of the lifetime of the circuit at which point the failure rate statistically increases rapidly to eventually result in 100% failure. Providing for accurate prediction of the onset of the third stage of the circuit life is not trivial. The following disclosure may provide for an advantageous apparatus which is configured to provide for prediction of the onset of the third stage 108 of the circuit lifetime or, more generally, provide a warning of possible failure.

Failure of a circuit may be caused by one or more of several failure mechanisms which depend on the circuit components forming the circuit and the environmental conditions in which they operate, such as corrosion, electromigration, hot carrier injection, hillock formations and others. The following disclosure may provide an apparatus and method that are effective at failure-prediction of a circuit no matter what the cause of the failures is. This may reduce or remove a need to model multiple possible failure mechanisms for a given circuit in order to provide for failure-prediction.

Figure 2:
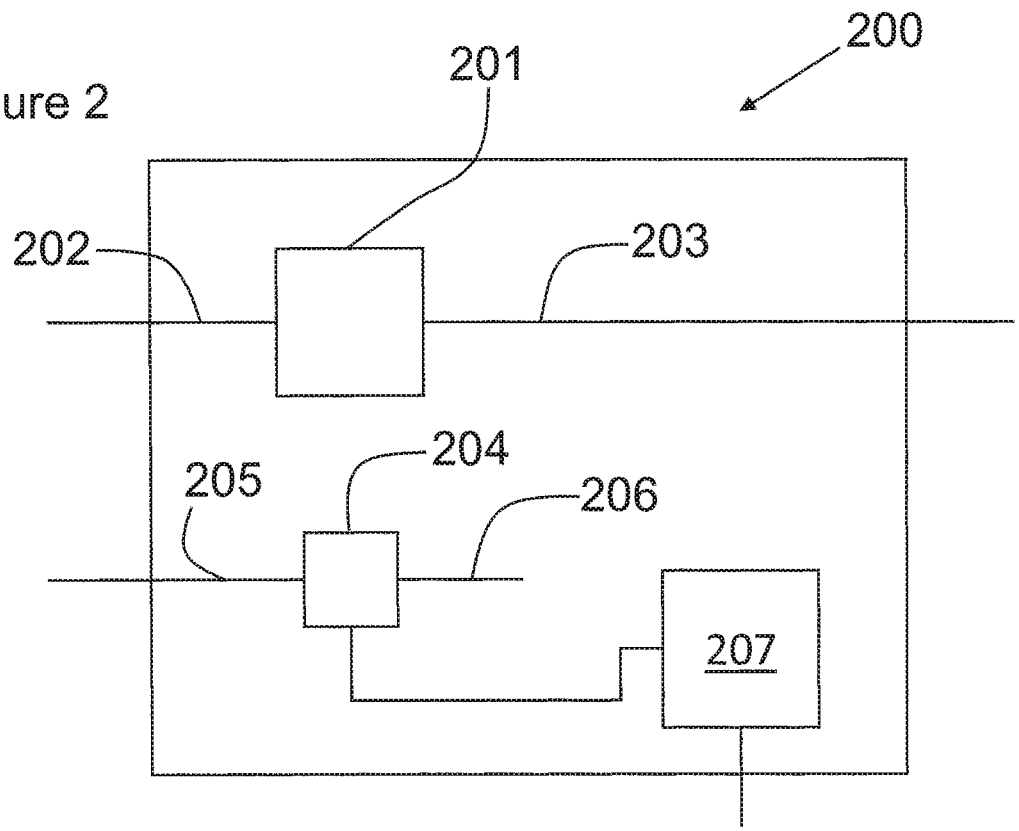
FIG. 2 shows an example embodiment of an apparatus comprising a functional circuit and a failure-prediction circuit.

As shown in FIG. 2, the present disclosure is directed towards an apparatus 200 comprising a functional circuit 201 comprising one or more circuit components configured to perform a function based on one or more first input signals 202. It will be appreciated that the one or more first input signals 202 comprise one or more signals received by the functional circuit 201 and may be received from a source external to the apparatus or may be locally generated signals such as power-on reset signals or those generated by an internal oscillator. For example, the functional circuit 201 may be configured to provide for one or more output signals 203 which are passed to one or more further components in order to provide for operation of the apparatus 200 or an electronic device of which the apparatus forms a component part. The one or more circuit components of the functional circuit 201 may comprise one of or any combination of passive electronic components such as capacitors, resistors, diodes, inductors, electrodes or other passive electronic components or may comprise active electronic components such as amplifiers, transistors or silicon controlled rectifiers or a combination thereof. The functional circuit 201 may comprise a subset of the components of a larger circuit. The functional circuit may be a functional integrated circuit. The functional circuit may comprise one or more stand-alone components which are not integrated.

The apparatus 201 further comprises at least one failure-prediction circuit 204 for use in predicting failure of the functional circuit 201. The failure-prediction circuit 204 comprises a replica of the functional circuit 201 in terms of constituent circuit components. Thus, the failure-prediction circuit 204 comprises substantially the same circuit components as the functional circuit 201, but the circuit components of the failure-prediction circuit 204 are configured to be more susceptible to failure than those of the functional circuit 201. The failure-prediction circuit may be a failure-prediction integrated circuit. The failure-prediction circuit may comprise one or more stand-alone components which are not integrated. In another embodiment, the failure-prediction circuit may comprise a portion of an integrated circuit. As shown by the dotted line 109 of FIG. 1, the onset of the end-of-life failures for the failure prediction circuit occurs earlier, on average, than for the functional circuit, which is represented by the dotted and dashed line 104.

In summary, in one or more embodiments, the failure-prediction circuit 204 is configured to be statistically more susceptible to failure due to it being fabricated in a way that makes it less durable than the functional circuit 201; or it may be stressed more in operation by, for example, application of input signals of greater magnitude; or it may be subjected to higher operating temperatures or field strengths; or a combination of the above may be used. These options will be described in more detail below.

In a first example, as mentioned above, the one or more circuit components of the failure-prediction circuit 204 may be fabricated to have one or more dimensions that are more susceptible to failure than the corresponding dimensions of the functional circuit 201. It will be understood that, for example, the area of a junction of a transistor may be a factor in its susceptibility to failure. In another example, the width of a terminal of an electronic component may impact its susceptibility to failure. As a further example, the thickness of a semi-conductor layer in an electronic component may affect its susceptibility to failure. For instance, a thinner gate of a transistor may result in failure before a transistor with a thicker gate because a gate formed of a thicker layer may be more durable. It will be appreciated that dimensions of other parts may influence the susceptibility of failure. Thus, providing for a failure-prediction circuit 204 with a transistor having a thinner or narrower gate region than a corresponding transistor of the functional circuit 201 may provide for a failure-prediction circuit 204 which is statistically more susceptible to failure than the functional circuit 201, thereby providing for time for action to be taken before the possible failure of the functional circuit. The identity of which dimensions of which components that should differ may be based on empirical analysis or modelling of possible modes of failure.

In some examples, providing a different dopant concentration in one or more of the circuit components of the failure-prediction circuit 204 than in the functional circuit 201 may make the failure-prediction circuit 204 more susceptible to failure than the functional circuit 201.

In another example, the one or more circuit components of the second failure-prediction circuit may be fabricated having a different shape more susceptible to failure than the corresponding shape of the first failure-prediction circuit. For example, certain shapes of electronic circuit components may provide for larger current density in certain parts of the component which thereby results in an increased rate of wear-out of the component and, thereby, an increased susceptibility to failure. In some examples, sharper edges of components or junctions may result in such an increase in susceptibility of failure of a circuit component.

In one or more embodiments, the failure-prediction circuit 204 may be configured to be more susceptible to failure because it is configured to be provided with one or more second input signals 205 based on the one or more first input signals 202, the one or more second input signals 205 comprising at least one property that is greater in magnitude than the corresponding property of the one or more first input signals 202. The one or more second input signals 205 may be based on the one or more first input signals 202 at least in terms of the apparatus 200 being configured to provide the one or more second input signals 205 to the failure-prediction circuit 204 for substantially the same time duration that the one or more first input signals 202 are received by the functional circuit 201. In this way, the one or more second input signals 205 may be provided to the failure-prediction circuit 204 during operation of the functional circuit 201 in order to provide for a substantially similar operating lifetime until the point of failure. If the failure-prediction circuit 204 comprises identical circuit components to the functional circuit 201, the higher stress caused by the one or more second input signals 205 having at least one property having a greater magnitude than that received by the functional circuit 201 may lead to greater stress and therefore statistically earlier failure of the failure-prediction circuit 204 than the functional circuit 201. The properties which may have a greater magnitude are those which would provide a higher stress on the failure-prediction circuit 204. The property may include electronic properties of the one or more second input signals 205. For example, the magnitude of the voltage, current, signal frequency or bandwidth of the one or more second input signals 205 may be greater than the corresponding voltage, current, frequency or bandwidth of the one or more first input signals 202. In some examples, the frequency of programming/deleting operations performed on a circuit component may be of greater magnitude for the failure-prediction circuit 204 as compared to the functional circuit 201, at least on average or in terms of peak frequency, in some embodiments, programming/deleting operations may be performed on an erasable programmable read-only memory (EPROM) or a magnetoresistive random access memory (MRAM). It will be appreciated that other properties of the one or more second input signals may also result in a higher stress on the failure-prediction circuit 204 which may result in it being more susceptible to failure than the functional circuit 201.

In one or more embodiments, the failure-prediction circuit 204 may be more susceptible to failure than the functional circuit 201 because the failure-prediction circuit 204 may be positioned relative to the functional circuit 201 such that, in use, the failure-prediction circuit 204 experiences a higher operating condition than the functional circuit 201. The operating condition may be, for example, a higher operating temperature or the failure-prediction circuit may be exposed to a higher local magnetic field than the functional circuit. For either condition, the higher operating condition may either be a higher average condition or a higher peak condition. For example, operating in a higher average temperature may cause damage to circuit components of the failure-prediction circuit or larger variations in local operating temperature may equally lead to a higher susceptibility to failure, while maintaining an equal average operating temperature. For example, analysis or modelling may be performed during design of the apparatus 200 in order to determine the temperature variation across the apparatus 200 during operation. Locations further away from heat sinks or further away from the edges of the apparatus 200 may be more susceptible to heating than others. Thus, the failure-prediction circuit 204 may be comprised of substantially similar circuit components as the functional circuit 201 and the one or more second input signals 205 may be substantially similar to the one or more first input signals 202, but by operating at a higher temperature, the failure-prediction circuit 204 may be more statistically prone to failing than the functional circuit 201.

It will be appreciated that any combination of two or more the above example methods may be implemented contemporaneously in order to provide for a failure-prediction circuit 204 which is more susceptible to failure than the functional circuit 201.

In contrast to the functional circuit 201, the failure-prediction circuit 204 may be configured to provide for one or more second output signals 206 which are not used by the apparatus 200 to perform any function other than to be measured to provide for failure prediction. For example, the failure-prediction may be configured to receive one or more second input signals 205 based on the one or more first input signals 202 and, from the one or more second input signals 205, produce one or more second output signals 206. Thus, in one or more examples, an output of the apparatus 200 is independent of the output 204 of the failure-prediction circuit 204 while being dependent on the output 203 of the functional circuit 201.

The apparatus 200 is configured to provide for prediction of failure of the functional circuit 201 based on a determination of failure of the failure-prediction circuit 204. Thus, because the failure-prediction circuit 204 is more susceptible to failing than the functional circuit 201, the detection of the failure of the failure-prediction circuit 204 allows for the possible upcoming failure of the functional circuit 201 to be predicted based on the real-life conditions experienced by both of the functional and failure-prediction circuits 201, 204 as opposed to basing failure-prediction on theoretical degradation rates under assumed operation conditions. Determination of failure of the failure-prediction circuit 204 may be performed by determining whether an output of the failure-prediction circuit 204 is outside of a predetermined acceptable range. For example, data relating to an acceptable range of outputs may be compared to the actual output of the failure-prediction circuit 204 in accordance with one or more of the following time schedules: at predetermined intervals, on start-up of the apparatus 200 and on receipt of an instruction signal. Because the failure-prediction circuit 204 is, in one or more examples, not configured to perform a specific function in the apparatus 200 other than to provide for failure-prediction, the determination of the failure of the failure-prediction circuit 204 can be performed while the apparatus 200 is operating as normal, i.e. while the apparatus 200 and the functional circuit 201 are online. Further, testing for failure does not require interruption of the function provided by the functional circuit 201. The data relating to the acceptable range of output signals may be stored in a test block 207 which comprises a part of the apparatus 200 or is remote from the apparatus 200, as in the example of FIG. 1, or it may be provided at a location remote from the apparatus 200 and configured to communicate with the failure-prediction circuit 204 of the apparatus 200 during use. It will be appreciated that the determination of failure of the failure-prediction circuit 204 may alternatively comprise the determination that the output of the failure-prediction circuit 204 exceeds a predetermined value, is less than a predetermined value or is equal to a predetermined value. The output of the failure-prediction circuit 204 that is measured to provide for failure determination may comprise, for example, one or more of: a breakdown voltage of a junction; the frequency of an oscillator such as a ring oscillator; the leakage current across a dielectric isolator; the voltage/current (VII) characteristic of a dielectric isolator; the V/I characteristic of a pn junction, for example, in a diode; the shift in the threshold voltage of a MOSFET; the drain current as a function of gate-source voltage; timing shifts of the output signal; a shift in the characteristics of a P-MOSFET compared to an N-MOSFET or complete loss of functionality of the one or more electronic components. It will be appreciated that in some circumstances, the difference in the above parameters may vary with local operating temperature and so the values of the measured output which is determined to correspond to failure may be temperature dependent. In another example, the variation with any of the aforementioned parameters with respect to time may provide for the prediction of failure of the functional circuit 201. For example, the output of the failure-prediction circuit 204 may be considered within acceptable operating bounds, however, the variation per hour (or any other time period) may be indicative of the level of stress experienced by the failure-prediction circuit 204 and so may provide for prediction of failure of the functional circuit.

As shown in FIG. 2, a first example apparatus 200 may comprise the functional circuit 201 configured to receive one or more first input signals 202 and provide an output of one or more first output signals 203 which are used by the apparatus 200 to perform a function. In this example, the one or more first output signals 203 are provided directly to a device external of the apparatus 200, however, it will be appreciated that these one or more first output signals 203 may be processed by other components which comprise part of the apparatus 200 before being provided to an output or the one or more first output signals 203 may be configured to provide a function of the apparatus 200 without being provided to an external device. In this example, the failure-prediction circuit 204 receives one or more second input signals 205, these one or more second input signals 205 being based on the first one or more input signals 202 but are received from a different source. In this example, a smaller dimension of one of the circuit components of the failure-prediction circuit 204 makes the failure-prediction circuit 204 more susceptible to failure than the functional circuit 201. This is depicted in the figures by the smaller box for the failure-prediction circuit 204 compared to the functional circuit 201. The one or more second output signals 206 of the failure-prediction circuit 204 may not perform a function other than failure-prediction and are, for that reason, shown to provide for no further connection to another component of the apparatus or any external component.

In FIG. 2, a self-test block 207 is shown to be connected to the failure-prediction circuit 204 so that a determination of failure of the failure-prediction circuit 204 can be performed. An output terminal of the self-test block outputs signalling to be sent to one or more of a remote device and a display for providing a warning to the user, a manufacturer, a garage or another relevant person. For example, a warning may be provided to a monitoring server which monitors one or more apparatuses 200 for a prediction of failure of a functional circuit. Alternatively, the signalling may be provided to a display such as a heads-up display in a vehicle for warning the operator or a technician that failure is predicted, in another embodiment, the signalling may be provided to a mobile electronic device or hypervisor for signalling directly to a user, a manufacturer or a garage. In another embodiment, signalling may be provided to a remote circuit comprising part of the apparatus 200. For example, in some examples the functional circuit 201 and the failure-prediction circuit 204 may be operated at the limit of their specification or even beyond. This may be done when overclocking the functional circuit 201, such as when overclocking a computer CPU or graphics card. The signalling to the remote circuit or signalling to a remote device may provide a signal to stop the overclocking mode, thereby reducing the strain on the functional circuit 201 and extending its remaining lifetime. Thus, on prediction of failure of the functional circuit 201, signalling may be provided to stop the functional circuit 201 from operating in an overclocking mode. Alternative modes of operation may be triggered by said signalling in order to extend the lifetime of the functional circuit other than to stop an overclocking mode, such as signalling in order to operate the functional circuit (or apparatus as a whole) in a low power mode.

Figure 3:
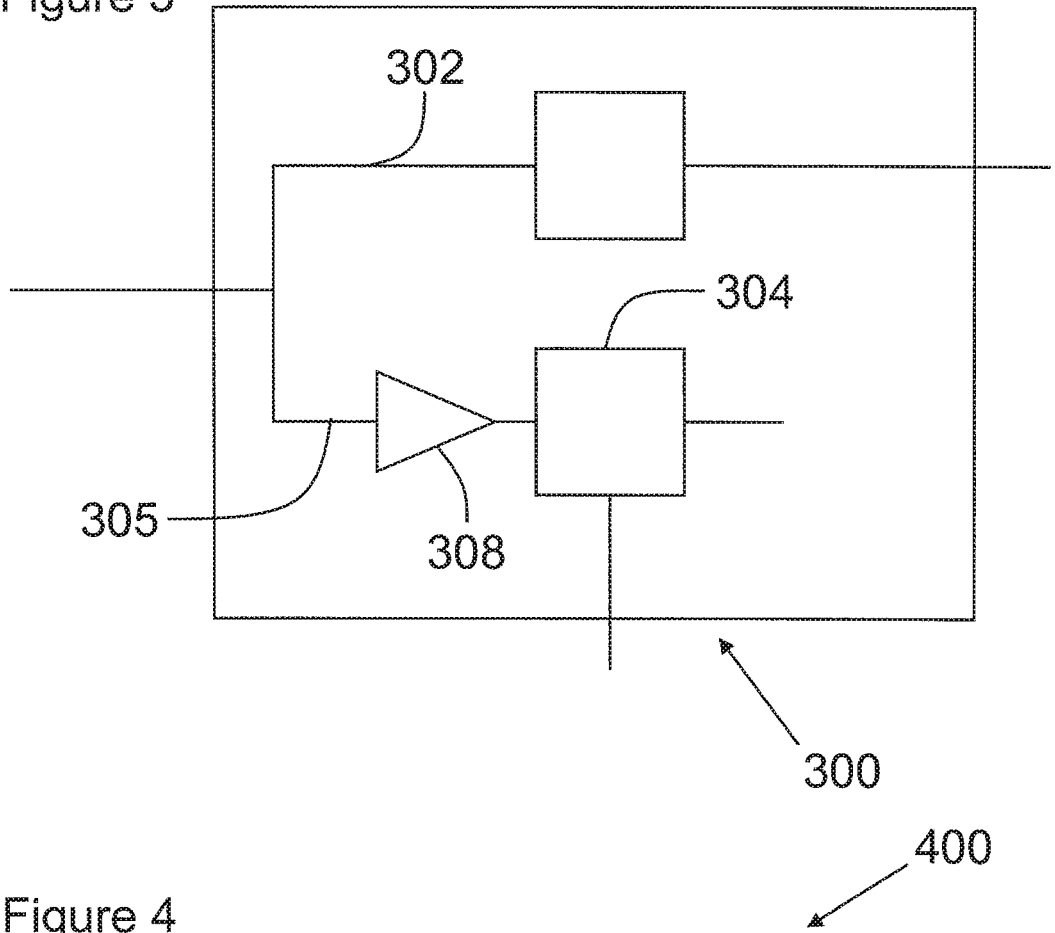
FIG. 3 shows an alternative example embodiment of an apparatus comprising a functional circuit and a failure-prediction circuit.

In another example, as shown by FIG. 3, the one or more first input signals 302 and the one or more second input signals 305 may be received from the same source but the one or more second input signals 305 may be received by and output by a magnitude-increasing-component 308, such as an amplifier or a frequency multiplier prior to receipt by the failure-prediction circuit 304. In this example, the magnitude-increasing-component comprises an amplifier which provides the one or more second input signals 305 with a signal having a greater voltage magnitude than the one or more first input signals. As previously, the one or more first output signals 302 provide for a function of the apparatus 300 and the one or more second output signals may not provide for any function other than failure prediction. In this example, the determination of the failure of the failure-prediction circuit 304 is provided for by a remote-test block which is remote from the apparatus 300 and communicates with the failure-prediction circuit 305.

In some examples, a plurality of failure-prediction circuits and/or a plurality of functional circuits may be provided in a single apparatus. The relative failure susceptibility of a plurality of failure-prediction circuits may be either the same or different. Where the failure-susceptibility of a plurality of failure-prediction circuits is the same, redundancy against false predictions of failure is provided for by only determining that failure of the functional circuit is likely to occur soon if, for example, a sub-set of a predetermined number of the failure-prediction circuits fail. As shown in FIG. 1, there is a small chance that, during the expected operating period of a circuit, a circuit may fail anyway. Providing for redundancy is a failsafe against triggering a premature prediction of failure of the functional circuit given statistical variations. Where a plurality of failure-prediction circuits have different susceptibilities to failing, staged warnings can be provided to a user of a device to give increasingly urgent predictions of failure of a functional circuit and its associated apparatus. Where a plurality of functional circuits are provided, the failure of all of these functional circuits can be predicted by one or more failure-prediction circuits. In this way, the failure of a large number of functional circuits, for example, may be predicted by a smaller number of failure-prediction circuits. The implementations and uses of having a plurality of failure-prediction circuits are discussed in some specific examples below.

Figure 4:
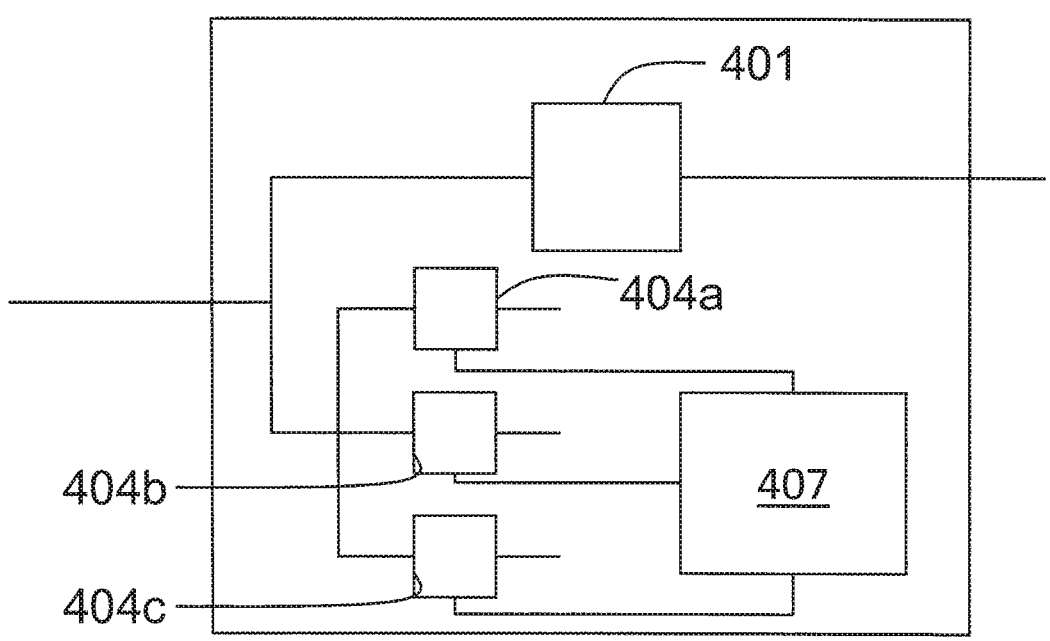
FIG. 4 shows an example embodiment of an apparatus comprising a functional circuit and a plurality of failure-prediction circuits.

In the example of FIG. 4, a plurality of failure-prediction circuits 404a, 404b, 404c are provided for use in predicting failure of the functional circuit 401, each of the plurality of failure-prediction circuits 404a, 404b, 404c having a critical dimension of one of more circuit components different to one or more critical dimensions of one or more corresponding circuit components of the functional circuit 401. It will be appreciated that, where a plurality of failure-prediction circuits 404a, 404b, 404c are provided, any manner of making the plurality of failure-prediction circuits 404a, 404b, 404c more susceptible to failure than the functional circuit 401 may be used. In this example three failure-prediction circuits have been used, however, it will be appreciated that two, four, or any other number of failure-prediction circuits 404a, 404b, 404c may be used.

In some embodiments, the plurality of failure-prediction circuits 404a, 404b, 404c may have different susceptibilities to failure to each other, however, the susceptibility to failure of all of the failure-prediction components 404a, 404b, 404c may be lower than the susceptibility to failure of the functional circuit 401. In this example, the detection of failure of a first failure-prediction circuit 404a of the plurality of failure-prediction circuits 404a, 404b, 404c may provide for a first prediction of failure. Detection of failure of subsequent failure-prediction circuits 404b, 404c may provide for the prediction of progressively more imminent failure of the functional circuit. In the example of FIG. 4, a first of the plurality of failure-prediction circuits 404a may be the most susceptible to failure and, on detection of its failure, an early warning signal may be provided to a user of the apparatus 400. On failure of a second failure-prediction circuit 404b, which is more prone to failure than the first failure-prediction circuit 404a and less prone to failure than a third failure-prediction circuit 404c, a second warning signal may be provided to a user of the apparatus 400. Finally, on failure of the third failure-prediction circuit 404c, an imminent warning signal may be provided to the user to indicate that the functional circuit 401, or the whole apparatus 400, should be replaced.

In another example, each of the plurality of failure-prediction circuits 404a, 404b, 404c may have the same susceptibility to failure as each other. In this example, redundancy may be provided for in the prediction of failure of the functional circuit 401 by only predicting the failure of the functional circuit 401 if a predetermined number of the plurality of the failure-prediction circuits 404a, 404b, 404c are determined to have failed. In the example of FIG. 4, failure of the functional circuit 401 may be predicted if two of the three failure-prediction circuits 404a, 404b, 404c is determined. This allows for redundancy in the case that a single failure-prediction circuit 404a, 404b, 404c fails far earlier than expected, for example due to device misfabrication.

It will be appreciated that, in a plurality of failure-prediction circuits 404a, 404b, 404c, a first subset of the failure-prediction circuits may have the same susceptibility to failure as each other while another plurality of failure-prediction circuits may have different susceptibilities to failure compared to each other. This example may provide for both redundancy of prediction of failure of the functional circuit 401 and a progressive indication of the imminence of the failure of the functional circuit 401. Where a plurality of failure-prediction circuits 404a, 404b, 404c are provided, a single self-test block 407 may be provided to determine whether any of the failure-prediction circuits 404a, 404b, 404c have failed or one self-test block 407 may be provided per failure-prediction circuit 404a, 404b, 404c.

In yet another embodiment, a first subset of the plurality failure-prediction circuits may be configured to be more susceptible to failure than the functional circuit in terms of a first factor such as one or more circuit components of the first subset of the plurality of failure prediction circuits having one or more dimensions more susceptible to failure than the corresponding dimension of the functional circuit. A second subset of the plurality of failure-prediction circuits may be configured to be more susceptible to failure than the functional circuit in terms of a second factor, different to the first factor, such as the second subset of the plurality of failure-prediction circuits may be configured to be provided with one or more second input signals based on the one or more first input signals, the one or more second input signals comprising at least one property that is greater in magnitude than the corresponding property of the one or more first input signals. It may also be that a third subset of the plurality of failure-pr-prediction circuits may be configured to be more susceptible to failure than the functional circuit in terms of a third factor, such as in terms of shape, operating temperature or operating local magnetic field. For example, nine failure-prediction circuits may be provided, three being more susceptible to failure than the functional circuit in terms of operating temperature, three more susceptible in terms of the voltage of their respective input signals compared to the functional circuit and three more susceptible in terms of the signal frequency of the one or more input signals they are configured to receive. Each of the sub-pluralities of failure-prediction circuits may comprise different susceptibilities to failure in order to provide for, statistically, a progressive indication of the imminence of failure of the functional circuit.

Figure 5:
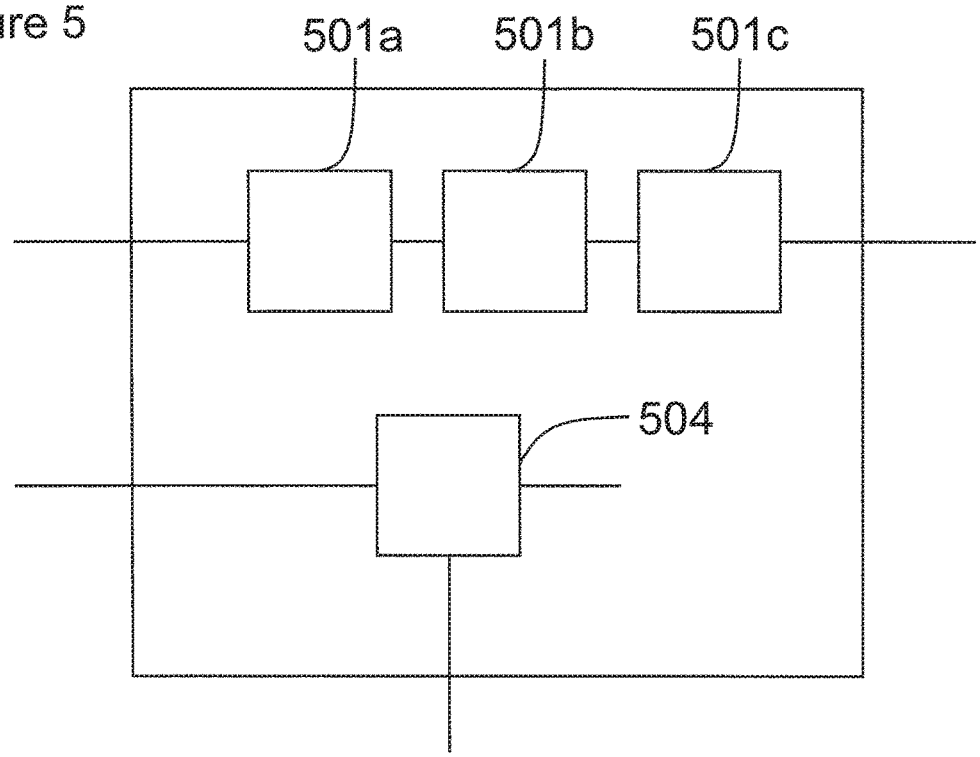
FIG. 5 shows an example embodiment of an apparatus comprising a plurality of functional circuit and a failure-prediction circuit.

In some examples, as depicted in FIG. 5, a single failure-prediction circuit 504 may be provided for the prediction of failure of a plurality of functional circuits 501a, 501b, 501c. In the example of FIG. 5, one failure-prediction circuit 504 is provided to provide for prediction of the failure of three functional circuits 501a, 501b, 501c. In some examples one or more failure-prediction circuits 504 may be provided to provide for the failure of a plurality of functional circuits 501a, 501b, 501c, i.e. a combination of the example embodiments from FIG. 4 and FIG. 5 may be provided. The ratio of failure-prediction circuits 504 to functional circuits 501a, 501b, 501c may be at least 1:10, 1:50, 1:100, 1:500, 1:1000 or any other ratio.

Figure 6:
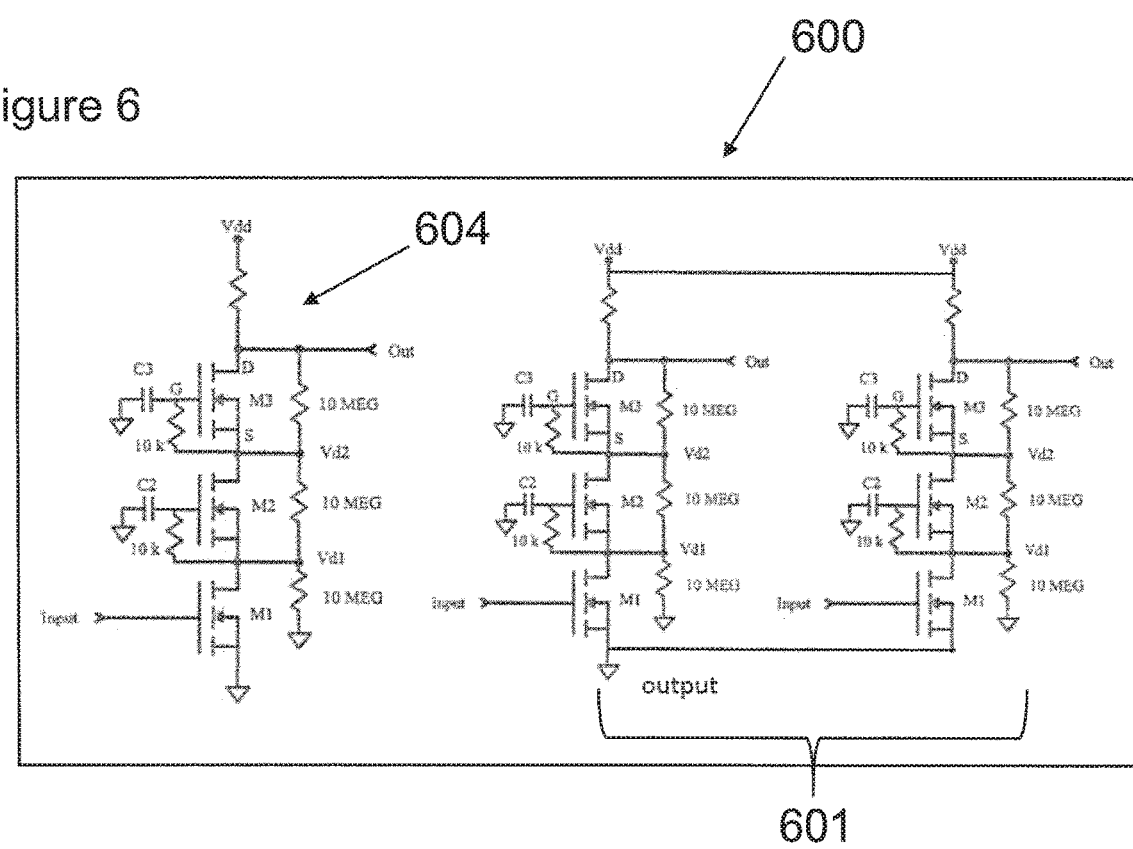
FIG. 6 shows an example embodiment of an apparatus comprising a plurality of functional circuits and a failure-prediction circuit.

FIG. 6 shows a more detailed example of an apparatus 600 similar to that of FIG. 5 wherein the apparatus 600 comprises a failure-prediction circuit 604 and two functional circuits 601. The exact combination of components used in this example is by no way limiting and is intended for exemplary purposes only.

Figure 7:
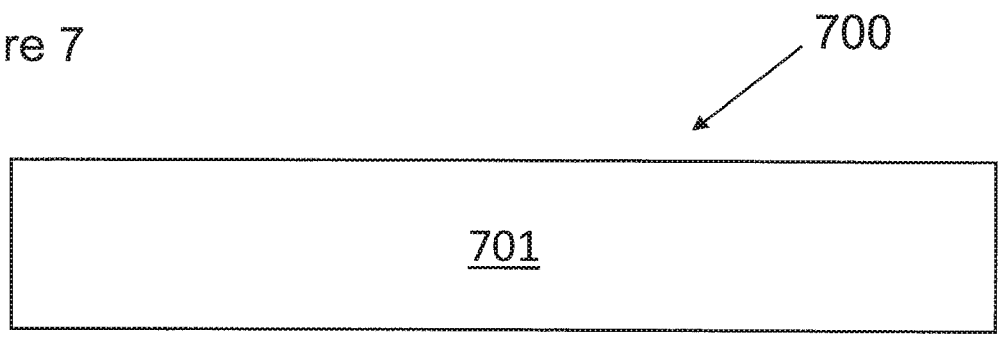
FIG. 7 shows an example embodiment of a method.

FIG. 7 shows a method 700 for providing prediction of failure of a functional circuit. The apparatus comprises: a functional circuit configured to receive one or more first input signal; a failure-prediction circuit for use in predicting failure of the functional circuit, the failure-prediction circuit comprising a replica of the functional circuit in terms of constituent circuit components. The failure prediction circuit is configured to be more susceptible to failure than said functional circuit in terms of one or more of: (a) the one or more circuit components of the failure-prediction circuit being fabricated having one or more dimensions more susceptible to failure than the corresponding dimensions of the functional circuit; (b) the failure-prediction circuit being configured to be provided with one or more second input signals based on the one or more first input signals, the one or more second input signals comprising at least one property that is greater in magnitude than the corresponding property of the one or more first input signals; and (c) the failure-pr-prediction circuit is positioned relative to the functional circuit such that, in use, the failure-prediction circuit experiences a higher average operating temperature than the functional circuit. The method 700 comprises the step of predicting 701 the failure of the functional circuit based on determining the failure of the failure-prediction circuit.

In some examples, the method 700 may comprise the step of, on determination that the failure-prediction circuit has failed, providing for signalling to be sent to: (a) a remote device; and (b) a display for providing a warning. In some embodiments the step of providing a failure-prediction circuit comprises providing a plurality of failure-prediction circuits for use in predicting failure of the functional circuit, each of the plurality of failure-prediction circuits comprising a replica of the functional circuit in terms of constituent circuit components, wherein each of the plurality of failure-prediction circuits is configured to be more susceptible to failure than said functional circuit in terms of one or more of: (a) the one or more circuit components of the failure-prediction circuit are fabricated having one or more dimensions more susceptible to failure than the corresponding dimensions of the functional circuit; (b) the failure-prediction circuit is configured to be provided with one or more second input signals based on the one or more first input signals, the one or more second input signals comprising at least one property that is greater in magnitude than the corresponding property of the one or more first input signals; and (c) the failure-prediction circuit is positioned relative to the functional circuit such that, in use, the failure-prediction circuit experiences a higher average operating temperature than the functional circuit. The method 700 further comprising the step of predicting the failure of the functional circuit based on determining the failure of at least a predetermined number of the plurality of failure-prediction circuits. The method 700 may further comprise the step of, on determination that a predetermined number of the plurality of failure-prediction circuits have failed, providing for signalling to be sent to: (a) a remote device; and (b) a display for providing a warning.

In one or more examples, the failure-prediction circuit is configured to receive the one or more second input signals when the functional circuit is not receiving the one or more first input signals. For example, the functional circuit may comprise a radio receiver and the failure prediction-part may comprise an oscillator such as a ring oscillator. The ring oscillator of the failure-prediction circuit may interfere with the radio receiver of the functional circuit if both components operate contemporaneously. In this example, the failure-prediction circuit may be configured to receive the one or more second input signals when the functional circuit is not receiving the one or more first input signals and, for example, the failure-prediction circuit may be configured to receive the one or more second input signals for a greater duration that the functional signal received the one or more first input signals.

Figure 8:
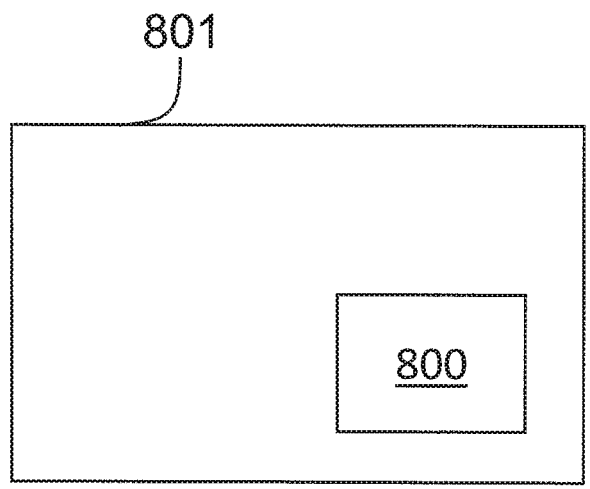
FIG. 8 shows an example electronic device comprising an apparatus.

FIG. 8 shows an electronic device 801 comprising an apparatus 800 as previously described. The apparatus 800 may be a safety critical apparatus within the electronic device 801 wherein failure of the apparatus 800 may lead to complete failure of the electronic device 801 or may lead to dangerous consequences for a user, another person, such as a driver or pedestrian, or a structure. The apparatus 800 may comprise a part of the electronic device 801 which is most likely to fail (or comprise a functional circuit which is statistically most likely to fail) before the rest of the electronic device 801. In this way, providing for failure-prediction of the functional circuit may provide a warning to a user of the electronic device 801 that maintenance should be carried out, for example.

In some examples, the electronic device 801 may comprise an automotive radar system, an automotive safety system device, or another electronic device in a vehicle. Unpredicted failure of certain parts of an automotive radar system may lead to dangerous consequences, such as unexpected operation of the vehicle if the automotive radar system or the automated-braking assistance fails. Alternatively, the electronic device may comprise: part of a mobile communications device; a medical equipment device such as a life support device, a heart pacemarker, an insulin pump or a brain stimulation circuit; a medical equipment monitoring device; an industrial safety system device, such as in a power plant; or a component part of a satellite, a plane or another electronic device wherein unexpected failure may lead to unacceptable consequences.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, internet-of-things or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. An apparatus, comprising:
    a first functional circuit comprising one or more first circuit components configured to perform a function based on one or more first input signals;
    a first failure-prediction circuit for use in predicting failure of the first functional circuit, the first failure-prediction circuit comprising one or more first replica circuit components of the first circuit components;
    wherein the first failure-prediction circuit is configured to be more susceptible to failure than said functional circuit in terms of:
        (a) the one or more first replica circuit components having one or more dimensions more susceptible to failure than the corresponding dimensions of the associated first circuit components;
        (b) the one or more first replica circuit components having a different shape more susceptible to failure than the corresponding shape of the associated first circuit components; and
        (c) the first failure-prediction circuit is positioned relative to the first functional circuit such that, in use, the first failure-prediction circuit experiences a higher operating temperature than the first functional circuit;
    wherein the apparatus is configured to provide a prediction of failure of the first functional circuit based on a determination of failure of the first failure-prediction circuit; and
    a second failure-prediction circuit for use in predicting failure of the first functional circuit, the second failure-prediction circuit comprising one or more second replica circuit components of the first circuit components,
    wherein the second failure-prediction circuit is configured to be more susceptible to failure than said first failure-prediction circuit in terms of the one or more circuit components of the second failure-prediction circuit are fabricated having one or more dimensions more susceptible to failure than the corresponding dimensions of the first failure-prediction circuit, and
    wherein the second failure-prediction circuit is configured to be provided with one or more third input signals based on the one or more first input signals, the one or more third input signals comprising at least one property that is greater in magnitude than the corresponding property of the one or more second input signals.

2. The apparatus of claim 1, wherein the one or more dimensions of the first replica circuit components comprises one or more of:
    (a) the area of a junction of a transistor component;
    (b) the width of a terminal of an electronic component; and
    (c) the thickness of a semi-conductor layer.

3. The apparatus of claim 1, wherein the first failure-prediction circuit is further configured to be more susceptible to failure than said first functional circuit in terms of the being provided with one or more second input signals based on the one or more first input signals, the one or more second input signals having at least one property that is greater in magnitude than the corresponding property of the one or more first input signals.

4. The apparatus of claim 3, wherein the one or more second input signals have a property that is greater in magnitude than the corresponding property of the one or more first input signals in terms of having one or more of:
(a) a greater voltage magnitude;
(b) a greater current magnitude;
(c) a greater frequency magnitude;
(d) a greater period magnitude; and
(e) a greater bandwidth magnitude.

5. The apparatus of claim 1, wherein the apparatus is configured to provide for determination of the failure of the first failure-prediction circuit in accordance one or more of the following time schedules:
(a) at predetermined intervals;
(b) on start-up of the apparatus; and
(c) on receipt of an instruction signal from a device remote from the apparatus.

6. The apparatus of claim 1, further comprising:
a testing block configured to provide said prediction of failure based on measurement of the failure of the first failure-prediction circuit.

7. The apparatus of claim 1, wherein the second failure-prediction circuit is configured to be more susceptible to failure than said first failure-prediction circuit in terms of:
(a) the one or more second replica circuit components are fabricated having one or more dimensions more susceptible to failure than the corresponding dimensions of the associated first circuit components; and
(b) the one or more second replica circuit components are fabricated having a different shape more susceptible to failure than the corresponding shape of the associated first circuit components;
wherein the apparatus is further configured to provide a prediction of failure of the first functional circuit based on a determination of failure of the second failure-prediction circuit.

8. The apparatus of claim 7 wherein the second failure-prediction circuit is configured to be more susceptible to failure than the first failure-prediction circuit in terms of:
(a) the one or more circuit components of the second failure-prediction circuit, at least in part, are fabricated having a different shape more susceptible to failure than the corresponding shape of the first failure-prediction circuit;
(b) the second failure-prediction circuit is positioned relative to the first failure-prediction circuit such that, in use, the second failure-prediction circuit experiences a higher operating condition than the first failure-prediction circuit and wherein the higher operating condition is one or more of, in use, a higher operating temperature and a higher local magnetic field strength.

9. The apparatus of claim 7 wherein the second failure-prediction circuit is configured to have the same susceptibility to failure as the first failure-prediction circuit in terms of:
(a) the one or more circuit components of the second failure-prediction circuit are fabricated having one or more dimensions equally susceptible to failure as the corresponding dimensions of the first failure-prediction circuit;
(b) the one or more circuit components of the second failure-prediction circuit are fabricated having a shape equally susceptible to failure as the corresponding shape of the first failure-prediction circuit;
(c) the second failure-prediction circuit is configured to be provided with one or more third input signals based on the one or more first input signals, the one or more third input signals comprising at least one property that is equal in magnitude to the corresponding property of the one or more second input signals; and
(d) the second failure-prediction circuit is positioned relative to the first failure-prediction circuit such that, in use, the second failure-prediction circuit experiences substantially the same operating condition as the functional circuit and wherein the operating condition is one or more of, in use, an operating temperature and a local magnetic field strength.

10. An apparatus, comprising:
a first functional circuit comprising one or more first circuit components configured to perform a function based on one or more first input signals;
a first failure-prediction circuit for use in predicting failure of the first functional circuit, the first failure-prediction circuit comprising one or more first replica circuit components of the first functional circuit;
wherein the failure-prediction circuit is configured to be more susceptible to failure than said functional circuit in terms of:
(a) the one or more first replica circuit components are fabricated having one or more dimensions more susceptible to failure than the corresponding dimensions of the associated first circuit components;
(b) the first failure-prediction circuit being provided with one or more second input signals based on the one or more first input signals, the one or more second input signals comprising at least one property that is greater in magnitude than the corresponding property of the one or more first input signals; and
(c) the first failure-prediction circuit is positioned relative to the first functional circuit such that, in use, the first failure-prediction circuit experiences a higher operating temperature than the first functional circuit;
wherein the electronic device is configured to provide a prediction of failure of the first functional circuit based on a determination of failure of the first failure-prediction circuit; and
a second failure-prediction circuit for use in predicting failure of the first functional circuit, the second failure-prediction circuit comprising one or more second replica circuit components of the first circuit components,
wherein the second failure-prediction circuit is configured to be more susceptible to failure than said first failure-prediction circuit in terms of the one or more circuit components of the second failure-prediction circuit are fabricated having one or more dimensions more susceptible to failure than the corresponding dimensions of the first failure-prediction circuit, and
wherein the second failure-prediction circuit is configured to be provided with one or more third input signals based on the one or more first input signals, the one or more third input signals comprising at least one property that is greater in magnitude than the corresponding property of the one or more second input signals.

11. A method for providing prediction of failure of a functional circuit of an apparatus, the apparatus comprising:
the functional circuit comprising one or more functional circuit components configured to perform a function based on one or more first input signals;
a first failure-prediction circuit for use in predicting failure of the functional circuit, the first failure-prediction circuit comprising one or more first replica circuit components of the functional circuit components;

wherein the first failure-prediction circuit is configured to be more susceptible to failure than said functional circuit in terms of one or more of:
  (a) the first failure-prediction circuit is configured to be provided with one or more second input signals based on the one or more first input signals, the one or more second input signals comprising at least one property that is greater in magnitude than the corresponding property of the one or more first input signals;
  (b) the first failure-prediction circuit is positioned relative to the functional circuit such that, in use, the first failure-prediction circuit experiences a higher environmental operating condition than the functional circuit; and
  (c) the first failure-prediction circuit is positioned relative to the functional circuit such that, in use, the first failure-prediction circuit experiences a higher operating temperature than the first functional circuit;
a second failure-prediction circuit for use in predicting failure of the functional circuit, the second failure-prediction circuit comprising one or more second replica circuit components of the first circuit components,
wherein the second failure-prediction circuit is configured to be more susceptible to failure than said first failure-prediction circuit in terms of the one or more circuit components of the second failure-prediction circuit are fabricated having one or more dimensions more susceptible to failure than the corresponding dimensions of the first failure-prediction circuit, and
wherein the second failure-prediction circuit is configured to be provided with one or more third input signals based on the one or more first input signals, the one or more third input signals comprising at least one property that is greater in magnitude than the corresponding property of the one or more second input signals; and
the method comprising:
  determining a failure of the failure-prediction circuit; and
  predicting the failure of the functional circuit based on determining the failure of the failure-prediction circuit.

12. The apparatus of claim 1, wherein the failure-prediction circuit is further configured to be more susceptible to failure than said functional circuit in terms of the being positioned relative to the functional circuit such that, in use, the failure-prediction circuit experiences a higher environmental operating condition than the functional circuit.

13. The apparatus of claim 1, further comprising:
a second functional circuit comprising one or more second circuit components configured to perform the function based on one or more second input signals, wherein the apparatus is configured to provide a prediction of failure of the second functional circuit based on a determination of failure of the first failure-prediction circuit.

14. The apparatus of claim 10, wherein the one or more dimensions of the first replica circuit components comprises one or more of:
  (a) the area of a junction of a transistor component;
  (b) the width of a terminal of an electronic component; and
  (c) the thickness of a semi-conductor layer.

15. The apparatus of claim 10, wherein the one or more second input signals have a property that is greater in magnitude than the corresponding property of the one or more first input signals in terms of having one or more of:
  (a) a greater voltage magnitude;
  (b) a greater current magnitude;
  (c) a greater frequency magnitude;
  (d) a greater period magnitude; and
  (e) a greater bandwidth magnitude.

16. The apparatus of claim 10, wherein the apparatus is configured to provide for determination of the failure of the first failure-prediction circuit in accordance one or more of the following time schedules:
  (a) at predetermined intervals;
  (b) on start-up of the apparatus; and
  (c) on receipt of an instruction signal from a device remote from the apparatus.

17. The apparatus of claim 10, further comprising:
a testing block configured to provide said prediction of failure based on measurement of the failure of the first failure-prediction circuit.

18. The apparatus of claim 10, wherein the second failure-prediction circuit is configured to be more susceptible to failure than said first failure-prediction circuit in terms of:
  the second failure-prediction circuit being provided with one or more second input signals based on the one or more first input signals, the one or more second input signals comprising at least one property that is greater in magnitude than the corresponding property of the one or more first input signals;
  wherein the apparatus is further configured to provide a prediction of failure of the first functional circuit based on a determination of failure of the second failure-prediction circuit.

19. The apparatus of claim 10, wherein the failure-prediction circuit is further configured to be more susceptible to failure than said functional circuit in terms of the being positioned relative to the functional circuit such that, in use, the failure-prediction circuit experiences a higher environmental operating condition than the functional circuit.

20. The apparatus of claim 10, further comprising:
a second functional circuit comprising one or more second circuit components configured to perform the function based on one or more second input signals, wherein the apparatus is configured to provide a prediction of failure of the second functional circuit based on a determination of failure of the first failure-prediction circuit.

* * * * *